United States Patent
Yuan

(10) Patent No.: US 6,392,492 B1
(45) Date of Patent: May 21, 2002

(54) HIGH LINEARITY CASCODE LOW NOISE AMPLIFIER

(75) Inventor: Xiaojuen Yuan, San Diego, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/897,535

(22) Filed: Jun. 28, 2001

(51) Int. Cl.[7] .................................................. H03F 1/22
(52) U.S. Cl. ...................................... 330/311; 330/296
(58) Field of Search ............................... 330/296, 302, 330/311

(56) References Cited

U.S. PATENT DOCUMENTS

| | | | | |
|---|---|---|---|---|
| 3,890,576 A | * | 6/1975 | Kobayashi | 330/18 |
| 4,250,463 A | * | 2/1981 | Foster | 330/298 |
| 6,147,559 A | * | 11/2000 | Fong | 330/311 |

OTHER PUBLICATIONS

Larson, L.E., "Integrated Circuit Technology Options for FRIC's–Present Status and Future Directions," IEEE Journal of Solid–State Circuits, vol. 33, No. 3 Mar. 1988, pp. 387–399.

* cited by examiner

Primary Examiner—Benny Lee
Assistant Examiner—Henry Choe
(74) Attorney, Agent, or Firm—Blakely, Sokoloff, Taylor & Zafman LLP

(57) ABSTRACT

A cascode low noise amplifier has high linearity while maintaining desirable values of other cascode configured low noise amplifier parameters. Emitter degeneration is employed to improve IIP3 while maintaining gain through bias optimization and providing a termination for harmonics produced in the circuit, resulting in maximization of linearity and dynamic range providing good noise figure, gain, in/out isolation and return loss.

10 Claims, 5 Drawing Sheets

HIGH LINEARITY CASCODE LOW NOISE AMPLIFIER

FIELD OF INVENTION

The present invention relates to solid state, low noise cascode amplifiers, and particularly to such amplifiers having high linearity.

BACKGROUND OF THE INVENTION

The present invention finds wide application in many forms of low noise amplifiers. One application of the invention is in WCDMA, wide band code division multiplex access, receivers in radio telephone transceivers. One current specification calls for a third order intercept point IIP3 of greater than five dBm. The cascode amplifier architecture is generally preferred in wireless applications. This topology provides excellent input to output isolation. However, in cascode low noise amplifier inherently has a lower IIP3 than single transistor, emitter amplifiers. It is highly desirable to provide excellent linearity in comparison with other cascode low noise amplifiers while maintaining a good noise figure, dynamic range, input/output isolation and minimize return loss.

SUMMARY OF THE INVENTION

It is an object of the present invention to provide a cascode low noise amplifier having high linearity while maintaining desirable values of other cascode configured low noise amplifier parameters. It is a further object of the present invention to provide an amplifier of the type described in which gain is maintained while emitter degeneration is utilized.

Briefly stated in accordance with the present invention, emitter generation is employed to improve IIP3 while maintaining gain through bias optimization. Termination for harmonics produced in the circuit is also provided. Consequently, linearity, dynamic range are both maximized. The harmonic termination minimized spurious signals when two tones are provided to the input of low noise amplifier.

BRIEF DESCRIPTION OF THE DRAWINGS

The manner in which the invention is achieved is pointed out with particularity in the claims forming the concluding portion of the specification. The invention, both as to its organization and manner of operation may be further understood by reference to the following description taken in connection with the following drawings.

Of the drawings.

DETAILED DESCRIPTION OF THE INVENTION

Figure 1:
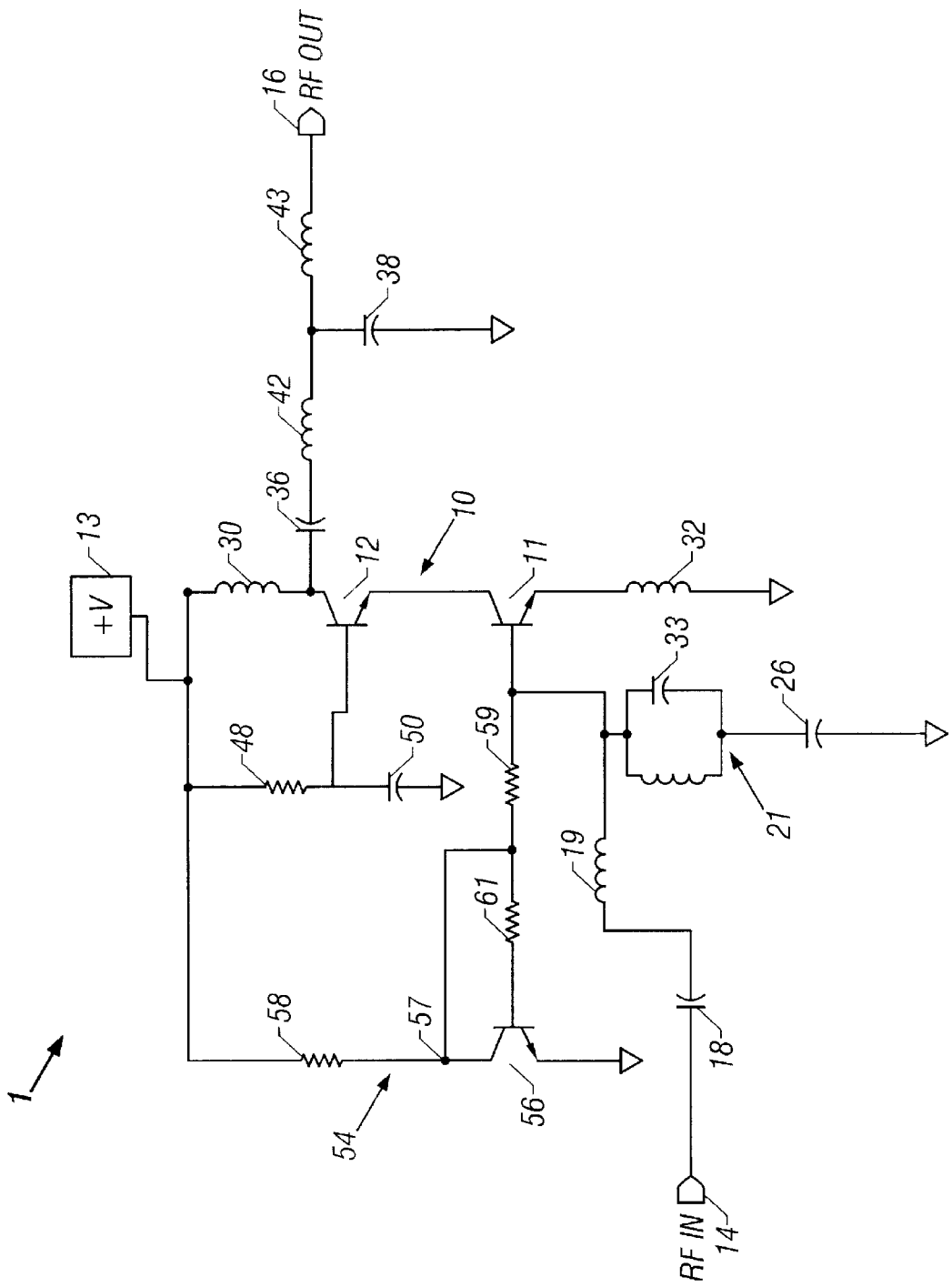
FIG. 1 is a schematic illustration of a cascode low noise amplifier constructed in accordance with the present invention.

Referring now to FIG. 1, an amplifier 1 constructed in accordance with the present invention is illustrated in schematic form. A cascode device 10 comprises a first, lower and second, upper transistor 11 and 12 respectively having their collector-emitter circuits connected in series between a source 13 of biasing potential and ground. The amplifier 1 has a radio frequency input terminal 14 and a radio frequency output terminal 16. An input radio frequency signal is provided via a DC blocking capacitor 18 connected in series with an inductor 19 provide a matching impedance to the base of the first lower transistor 11. The inductor 19 is commonly selected to transform the input impedance of the transistor 11 to 50 ohms. A parallel filter 21 including a capacitor 23 inductor 25 having values selected that the filter 21 is tuned to the RF input frequency, in the present example, 1.9 GHz. A DC blocking capacitor 26 is connected between filter 21 and ground. Since the filter 21 passes frequencies other than its resonant frequency, it will show a low impedance for unwanted harmonics, beep tones and other spurious frequencies. Consequently, linearity of the amplifiers will be improved.

Above the cascode device 10, i.e. between the collector of the transistor 12 and the source V, a loading inductor 30 is provided, which is one factor in determining gain to be obtained from the cascode configuration. Below the cascode device 10, namely between the emitter of the lower, first transistor 11 and ground, an inductor 32 is provided for inductive degeneration by linearizing the transistor 11.

A blocking capacitor 36 is connected to the output of the transistor 12, and connected in series between an opposite terminal of the capacitor 36 and the RF output terminal 16. A matching T circuit 38 is provided to establish a 50 ohm output impedance for the amplifier 1. The matching T circuit 38 comprises first and second inductors 42 and 43 in series between the capacitor 36 and the RF output terminal 16 and a capacitor 1 having a first terminal intermediate the inductors 42 and 43 and a second terminal connected to ground.

A biasing resistor 48 is connected between source V and the base of the upper cascode transistor 12 to establish the operating voltage for the two transistors 11 and 12. A DC blocking capacitor 50 is connected between the base of the upper, second transistor 12 and ground in order to ground radio frequency signals that may be present at the base of the upper, second transistor 12. A current mirror circuit 54 is utilized to control the DC current flowing through the upper and lower cascode transistor 11 and 12. A current source resistor 58 is connected between the source 13 and an output terminal 57, at the collector of a current mirror transistor 56. The emitter of the transistor 56 is connected to ground. A first resistor 59 is connected intermediate the output terminal 57 and the base of the lower cascode transistor 11. A second resistor 61 is connected intermediate the output terminal 57 and the base of the current mirror transistor 56 and is used to balance the resistor 59 in the current mirror.

In the present invention a plurality of techniques each improve IIP3performance in a cascode low noise amplifier. The embodiment has been constructed utilizing a 0.5 μm SiGe VICMOS construction. The particular example was designed to operate at a voltage of V<3 Volts, consumed 6 mA current with a simulated IIP3>9 dBm. Operating frequency was 2 GHz.

The degree the emitter degeneration is influenced by a number of factors. Degeneration provides for greater linearity. However, the permissible amount of emitter degeneration is limited by gain requirements. A limit on degeneration is also needed since distortion may occur in the upper, second transistor 12. In this example, it has been found that 1.5 nH, provides for requisite gain and sufficient degeneration for the common emitter lower cascode transistor 11. DC bias resistor 48 controls the voltage Vce of both lower and upper cascode transistors 11 and 12. A suitable value for the resistor 48 in the embodiment of the type described is 10 Kohm.

Use of the filter circuit 21 becomes particularly important when two tone signals are applied to the radio frequency input terminal 40. Assuming the two frequencies to be fa and fb, new frequencies generated will be at frequencies of 2fa, 2fb±fa, 2fb, 2 (fa−fb), 2 (fb−fa), as well as other harmonics and beat frequencies. These frequencies will generate third order intermodulation in the common-base connected upper, second transistor 12. Therefore, the tuned filter 2 removes the sources of distortion, since non-resident frequencies will be passed to ground.

Figure 2:
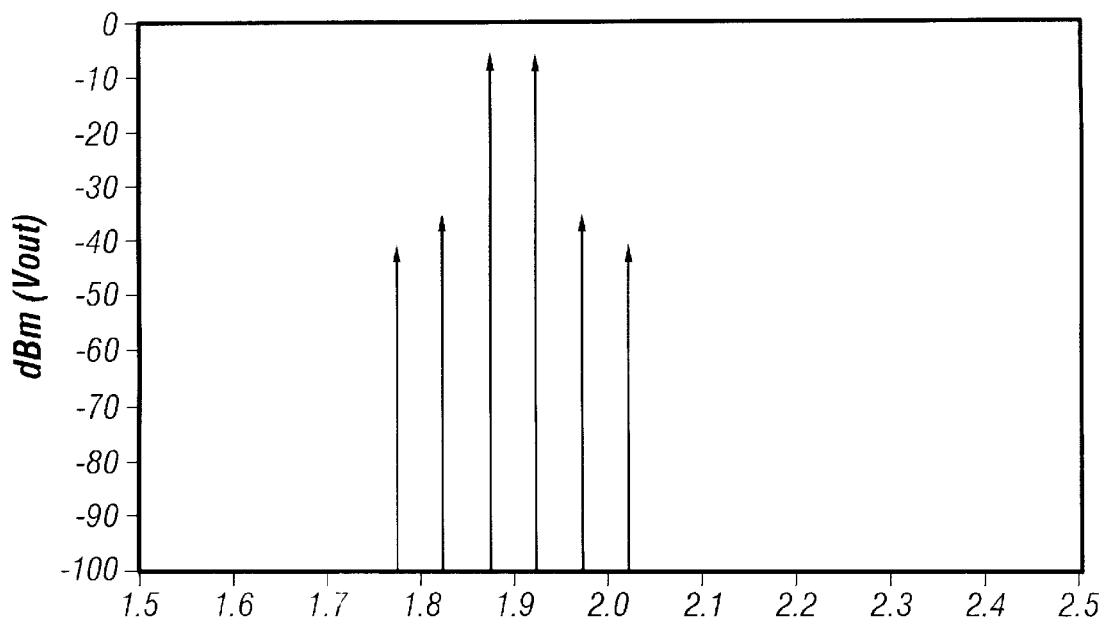
FIG. 2 is an illustration of IIP3 and a Vout spectrum versus frequency for a first value of a biasing resistor.
Figure 3:
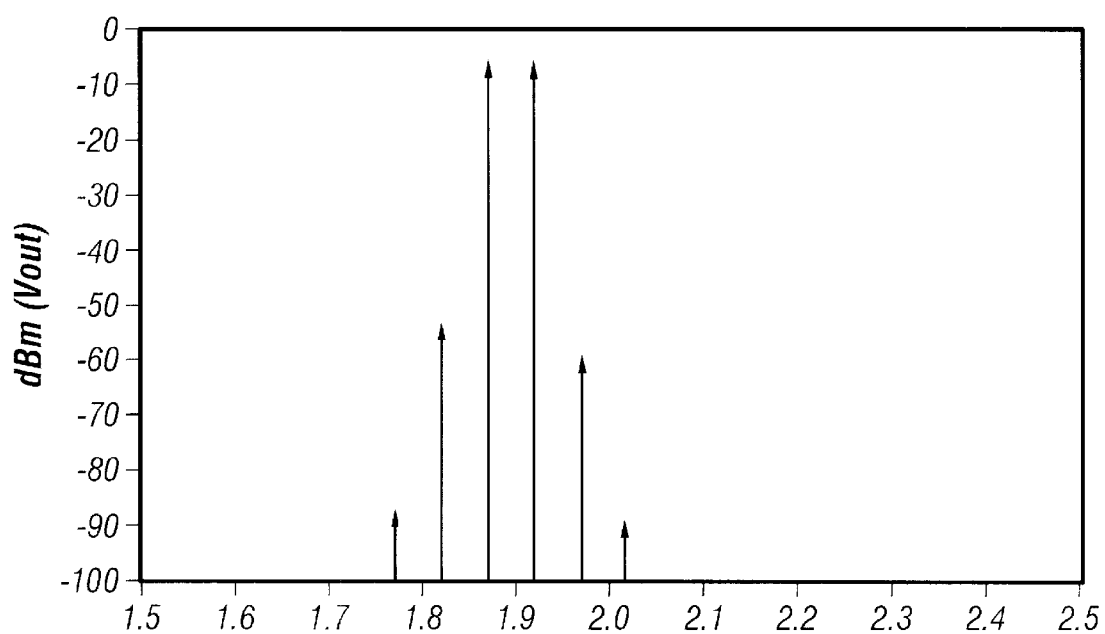
FIG. 3 is a graph similar to FIG. 2 illustrating IIP3 and Vout spectrum for a biasing resistor an order of magnitude higher than that illustrated in FIG. 2.

Views 2–11 illustrate the effect of various design considerations on the noise amplifier 1 performance. FIGS. 2 and 3 are each a plot of linearity in terms of IIP3 and Vout spectrum for examples in which the value of the resistor is 1 Kohm and 10 Kohm respectively. In this example, there is no harmonic termination circuit. The two tone input frequencies are fa=1.875 GHz and fb=1.925 GHz. Input power for each tone is −20 dbm. It is seen that the embodiment of FIG. 3 has an improved IIP3 of about 9 dB compared to the 1 Kohm test.

Figure 4:
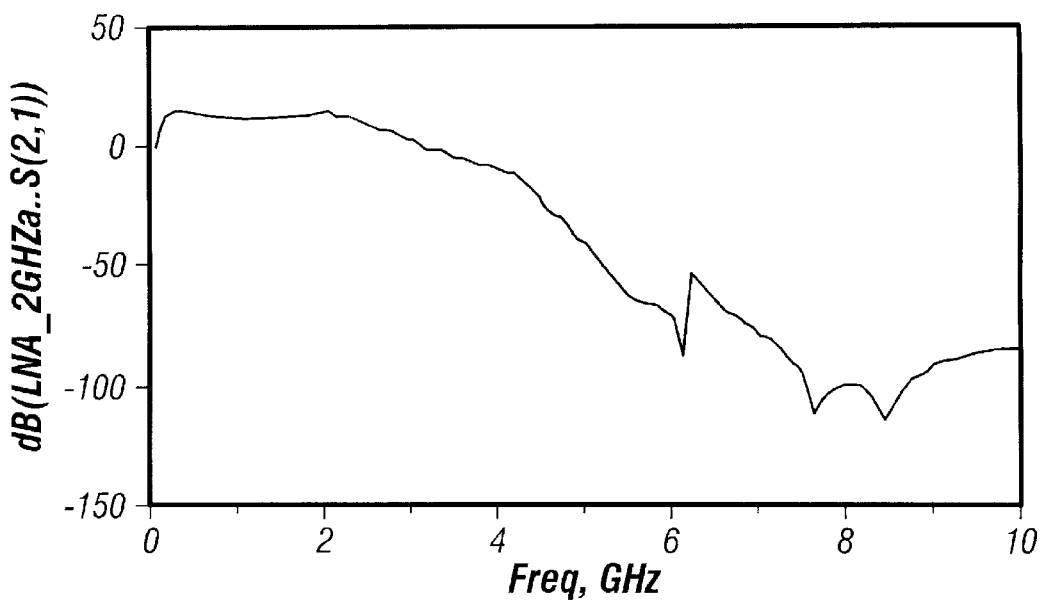
FIG. 4 is a plot of gain versus frequency over a range of 0 to 10 GHz.
Figure 5:
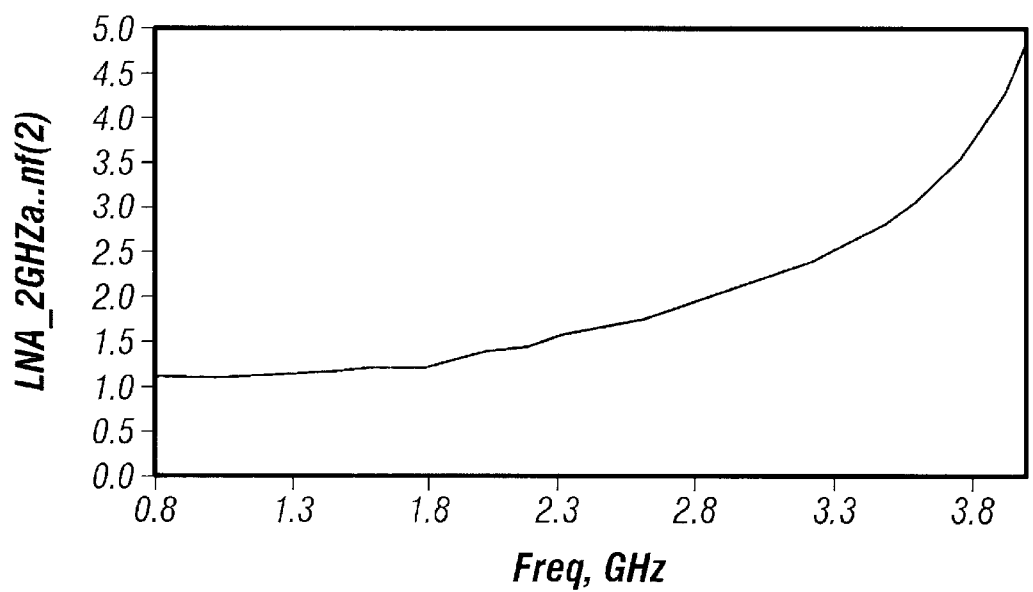
FIG. 5 is a plot of noise figure versus frequency over a range of 0.8 through 3.8 GHz.

FIGS. 4 and 5 respectively indicate gain for resistor 48 equaling 1 Kohm and 10 Kohm and noise figure for resistor 48 equals 1 Kohm and 10 Kohm. FIG. 4 is plotted over a frequency range of 0–10 GHz. FIG. 5 is plotted over a frequency of 0.8 to 3.8 GHz. It is seen that the plots substantially overlap, the places of thickened line indicating diversion of the two plots from each other. It is thus seen that the gain and noise figures do not change materially with this change in value of resistor 48.

Figure 6:
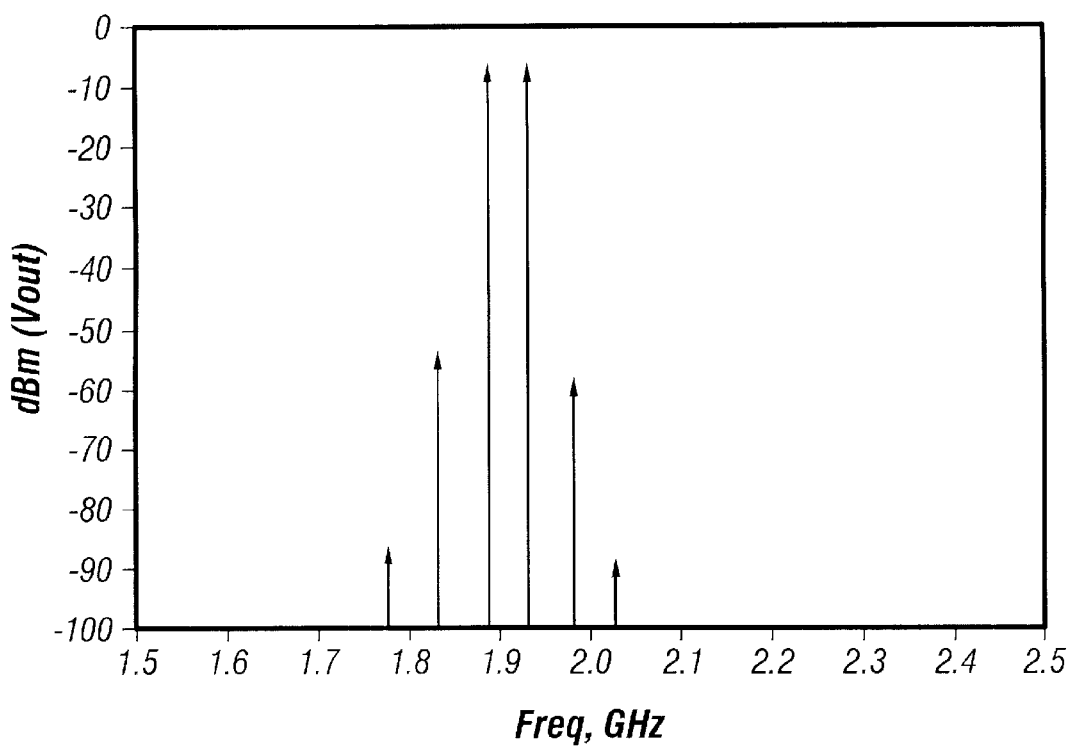
FIGS. 6 and 7 are charts corresponding to those of FIGS. 4 and 5 and illustrating amplifier gain or a biasing transistor value of 10 K with or without harmonic termination.
Figure 7:
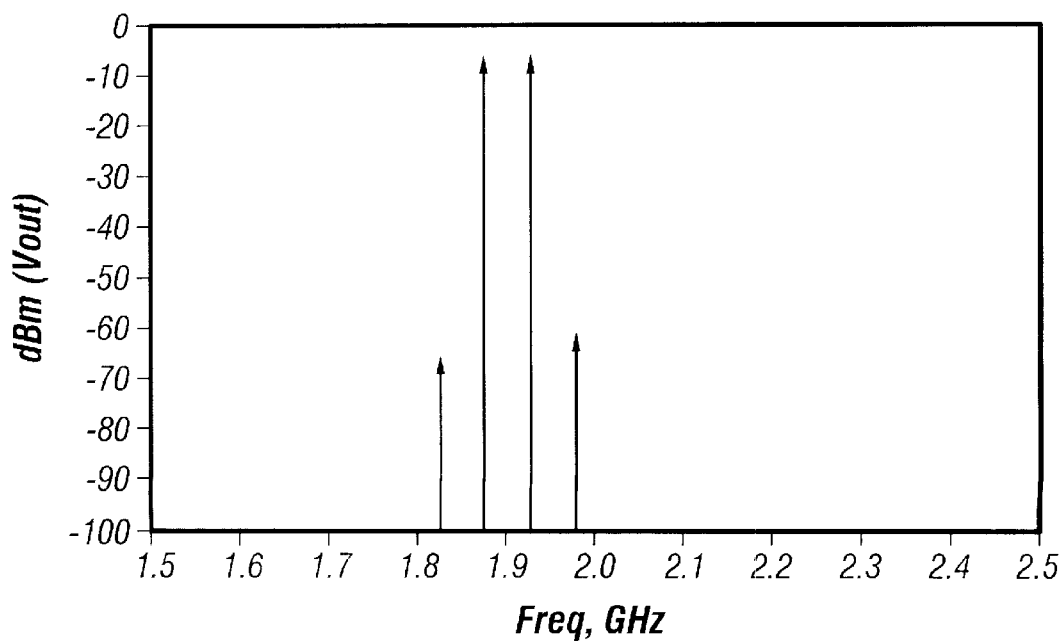
Figure 8:
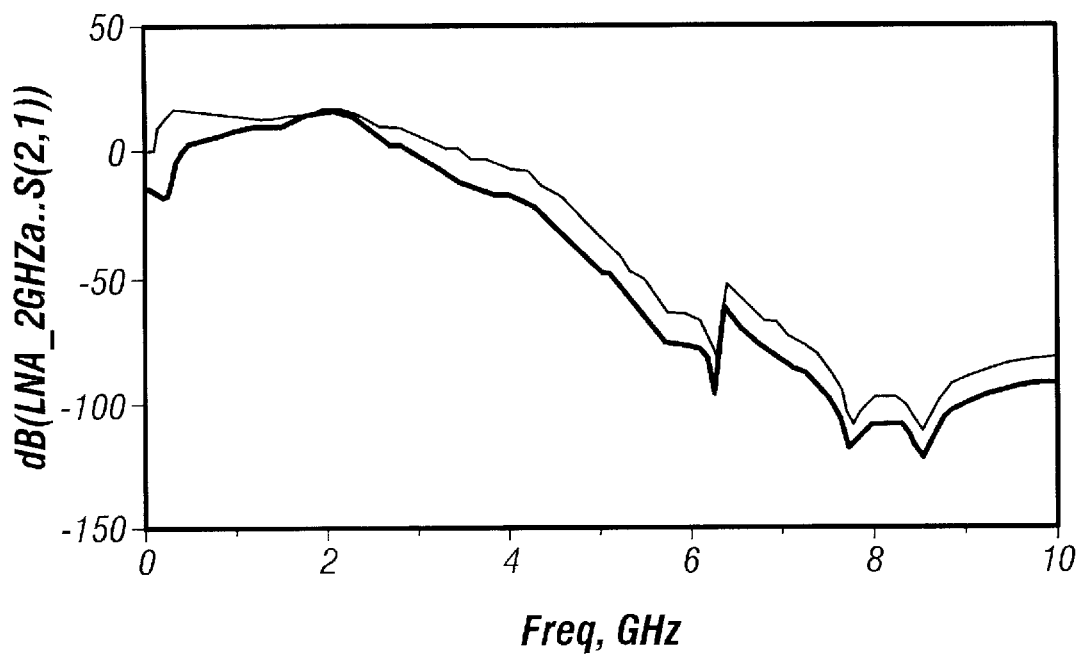
FIGS. 8 and 9 are graphs of linearity versus frequency with and without harmonic termination of the circuit of FIG. 1.
Figure 9:
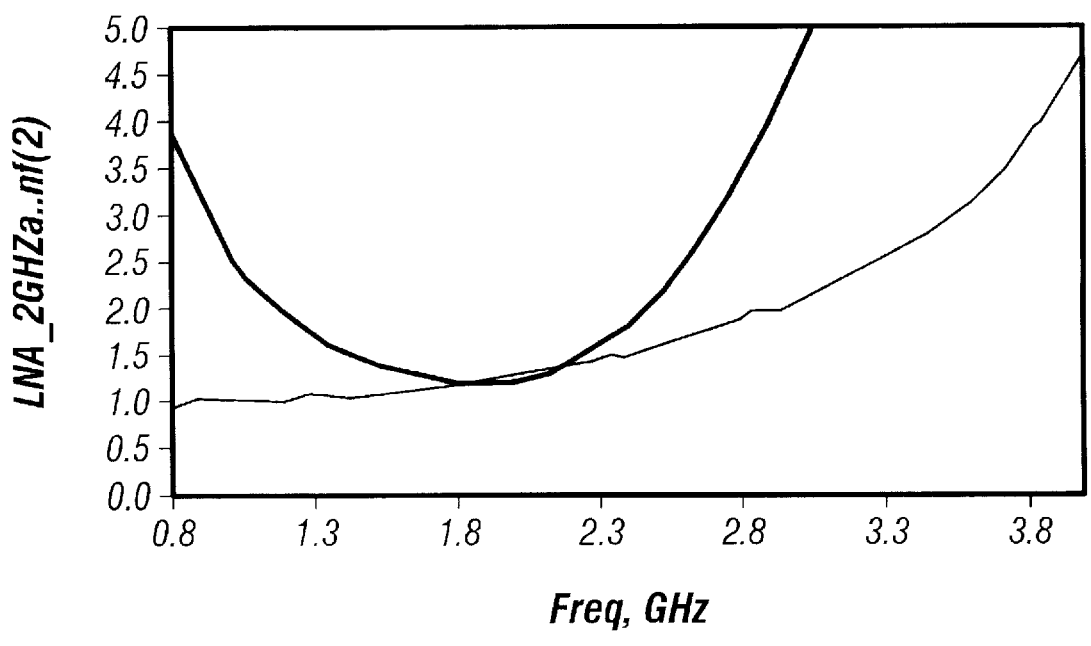

FIGS. 6 and 7 are linearity versus frequency plots for the circuit of FIG. 1 wherein resistor 48 has a value of 10 Kohm and without the filter 21 and with the filter 21 respectively. The number of non-fundamental frequencies is reduced. FIGS. 8 and 9 represent IIP3 for the resistor 48 having a value of 10 Kohm with and without the harmonic termination provided by the filter 21 respectively. FIG. 7 is plotted over a range of 0–10 GHz, and FIG. 8 is plotted over a range of 0.8–3.9 GHz. In each plot, the thinner line is the plot with harmonic termination. While difference in gain does not vary greatly in operating area around 2 GHz noise figure stable over a wider range of frequencies using harmonic termination.

The present description will enable those skilled in the art to provide many forms of low noise cascode amplifiers while making many departures from the specific examples set forth above.

What is claimed is:

1. A high linearity cascode low noise amplifier comprising:
    a cascode amplifier comprising a first, lower transistor connected in the common emitter mode and a second, upper transistor connected in the common base mode with their emitter-collector circuits connected in series, the collector of said upper transistor coupled to a bias source terminal and said lower transistor having its emitter coupled to ground, and input terminal coupled to the base of said lower transistor and an output terminal coupled to the collector of said upper transistor;
    a biasing resistor coupled between said bias source terminal and the base of said second, upper transistor, the value of said resistor determining voltage division between said lower first transistor and said upper, second transistor, whereby gain versus linearity for the low noise amplifier varies in correspondence with the value of said biasing resistor; and
    a loading inductor coupled between said bias source terminal and the collector of said upper transistor, whereby gain of the low noise amplifier varies in correspondence with the value of said loading inductor; current mirror circuit coupled between the emitter of second, upper transistor and a current source resistor.

2. The low noise amplifier of claim 1 wherein the value of said biasing resistor is selected to correspond to a preselected value for said low noise amplifier circuit.

3. The low noise amplifier according to claim 1 further comprising a degenerative inductor in the emitter circuit of said lower transistor having a value in a range providing linearity for said cascode device while avoiding distortion in said upper transistor.

4. The low noise amplifier according to claim 1 further comprising a blocking filter connected across the base emitter circuit of said lower transistor, said blocking filter tuned to the frequency range of expected radio frequency input, whereby intermodulation signals generated by said lower transistor will be short circuited to ground, whereby linearity is improved.

5. The low noise amplifier according to claim 3 wherein said degenerative inductor is selected to have a value on the order of 1 nH for an input frequency range centered at 1.9 GHz.

6. The low noise amplifier of claim 3 wherein first and second balancing resistors are connected in series between the bases of said lower, first transistor and a current mirror transistor, a terminal intermediate said first, lower transistor and a current mirror transistor being connected to a biasing transistor having an opposite terminal connected to the source terminal wherein said first and second balancing resistors are selected to have values in a ratio to minimize current consumption in the current mirror circuit.

7. The low noise amplifier according to claim 6 wherein said degenerative inductor is selected to have a value on the order of 1 nH for an input frequency range centered at 1.9 GHz.

8. A method for operating a low noise amplifier to optimize linearity versus gain with a cascode arrangement comprising a lower, first common emitter transistor and an upper, second, common base transistor comprising the steps of:
    setting the current through said cascode device with a current mirroring circuit;
    providing a biasing resistor between a biasing source and the base of said second, upper transistor to control the conductivity of said upper, second transistor and divide a bias voltage level between said lower transistor and said upper transistor to provide a point of operation for a maximum value of IIP3 for the cascode configuration; and
    providing a load inductor between said biasing source and a collector of said upper transistor, and setting gain of the low noise amplifier by setting a value of said loading inductor.

9. The method of claim 8 further comprising the step of grounding radio frequency signals outside of an input signal range at the input to said first, lower transistor.

10. The method of claim 9 further comprising the step of providing inductive degeneration at the emitter of said lower, first transistor.

* * * * *